United States Patent [19]

Pelloni

[11] Patent Number: 5,285,401
[45] Date of Patent: Feb. 8, 1994

[54] METHOD AND APPARATUS FOR CONVERTING SCANNING VALUES OF AN INPUT SCANNING SEQUENCE

[75] Inventor: Daniele Pelloni, Zurich, Switzerland

[73] Assignee: Studer Revox Ag, Regensdorf, Switzerland

[21] Appl. No.: 989,890

[22] Filed: Dec. 10, 1992

Related U.S. Application Data

[63] Continuation of Ser. No. 651,801, Feb. 7, 1991, abandoned.

[30] Foreign Application Priority Data

Feb. 7, 1990 [CH] Switzerland ............ CH00395/90-1

[51] Int. Cl.$^5$ .................................................. G06F 15/31
[52] U.S. Cl. .................................................. 364/724.1
[58] Field of Search ........................ 364/724.1, 723; 375/118

[56] References Cited

U.S. PATENT DOCUMENTS 4,954,824  9/1990  Yamada et al. ............... 364/724.1
5,051,981  9/1991  Kline ............................ 364/724.1

Primary Examiner—David H. Malzahn
Attorney, Agent, or Firm—Sandler Greenblum & Bernstein

[57] ABSTRACT

A method and apparatus for generating a further scanning frequency from an input scanning frequency and an output scanning frequency which is located very close to an input scanning frequency or output scanning frequency. A further scanning frequency is derived from the input scanning frequency and the output scanning frequency. Scanning values of an input scanning sequence are converted by a first conversion into scanning values of a further scanning sequence with a further scanning frequency. The scanning values of the further scanning sequence are converted into scanning values of an output scanning sequence. An adaptation on one of the two conversions of the scanning frequencies is then performed and a scanning rate conversion with a predetermined ratio is performed on the other of the two conversions. Phase errors and deviations of the scanning frequency, which may be contained in the further scanning sequence, are compensated for by delaying the scanning values and by performing a periodically occurring change-over process.

28 Claims, 3 Drawing Sheets

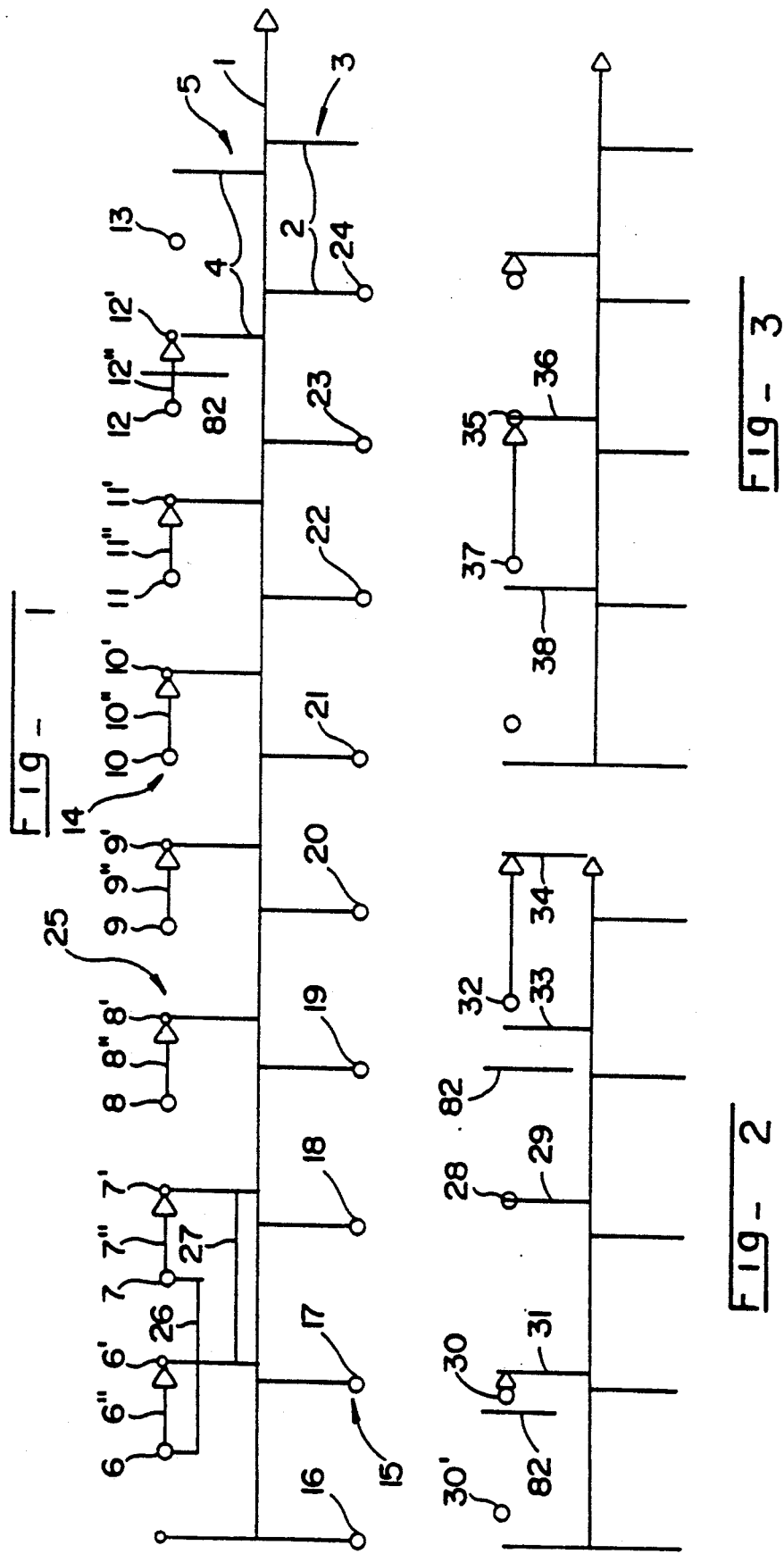

Fig. 4

| 1 | 2 | 3 | 4 | 5 | 6 | 7 | 8 | 9 | 10 | 11 | 12 | 13 | 14 | 15 | 16 | |
|---|---|---|---|---|---|---|---|---|---|---|---|---|---|---|---|---|
| $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ | $x_{16}$ | 41 |
| $x_0$ | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ | 42 |
| $x_1$ | $x_2$ | $x_3$ | $x_4$ | $x_5$ | $x_6$ | $x_7$ | $x_8$ | $x_8$ | $x_9$ | $x_{10}$ | $x_{11}$ | $x_{12}$ | $x_{13}$ | $x_{14}$ | $x_{15}$ | 43 |
| $x_1$ | $x_2$ | $x_3$ | $x_4$ | $c_0$ | $c_1$ | $c_2$ | $c_3$ | $c_4$ | $c_5$ | $c_6$ | $c_7$ | $c_8$ | $x_{13}$ | $x_{14}$ | $x_{15}$ | 44 |

Fig. 5

| 1 | 2 | 3 | 4 | 5 | 6 | 7 | 8 | 9 | 10 | 11 | 12 | 13 | 14 | 15 | 16 | |
|---|---|---|---|---|---|---|---|---|---|---|---|---|---|---|---|---|
| $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ | $x_{16}$ | 46 |
| $x_0$ | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ | 47 |
| $x_0$ | $x_1$ | $x_2$ | $x_3$ | $x_4$ | $x_5$ | $x_6$ | $x_7$ | $x_9$ | $x_{10}$ | $x_{11}$ | $x_{12}$ | $x_{13}$ | $x_{14}$ | $x_{15}$ | $x_{16}$ | 48 |
| $x_0$ | $x_1$ | $x_2$ | $x_3$ | $c_0$ | $c_1$ | $c_2$ | $c_3$ | $c_4$ | $c_5$ | $c_6$ | $c_7$ | $c_8$ | $x_{14}$ | $x_{15}$ | $x_{16}$ | 49 |

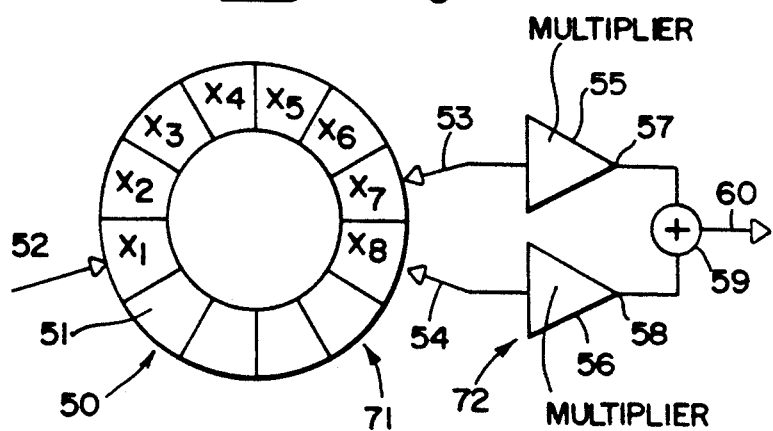

Fig. 6

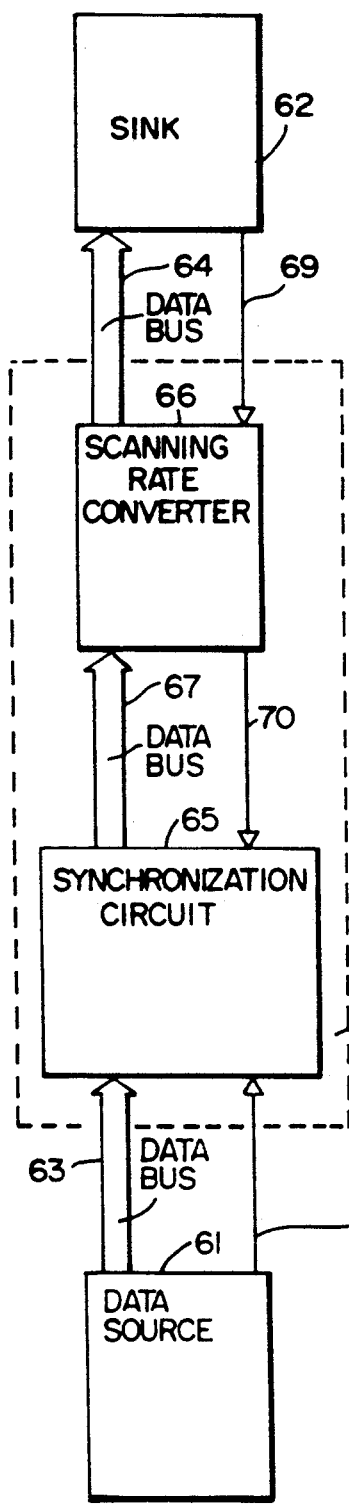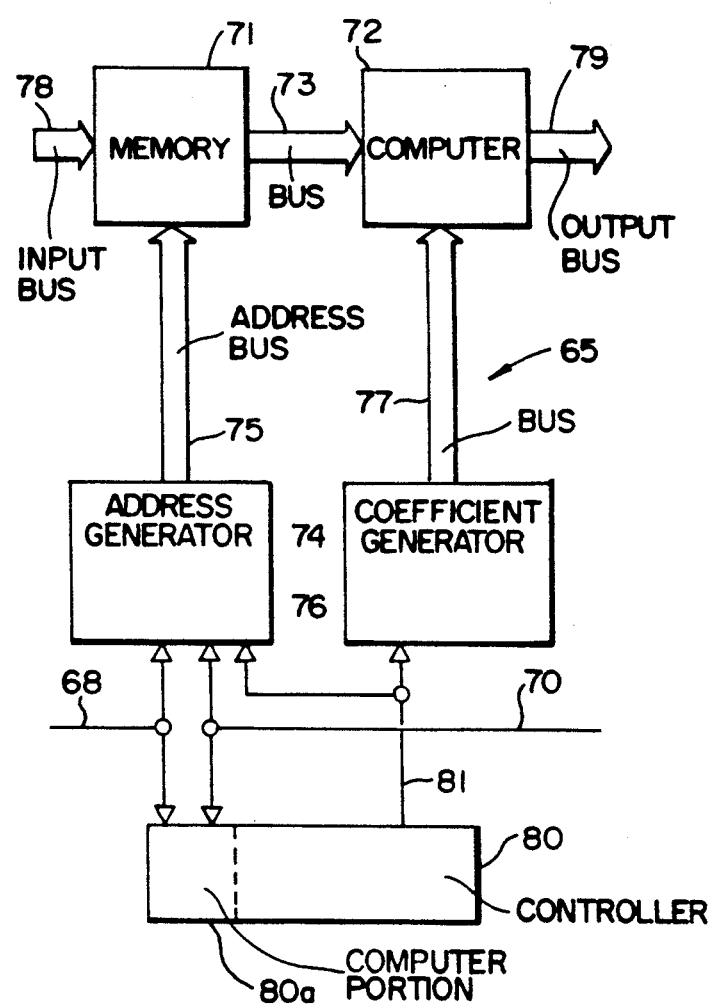

METHOD AND APPARATUS FOR CONVERTING SCANNING VALUES OF AN INPUT SCANNING SEQUENCE

This application is a continuation of application Ser. No. 07/651,801, filed Feb. 7, 1991, now abandoned.

FIELD OF THE INVENTION

The present invention is directed to a method and apparatus for converting scanning values of an input scanning sequence which occur with an input scanning frequency, into scanning values of an output scanning sequence which occur with an output scanning frequency.

DISCUSSION OF BACKGROUND AND RELEVANT INFORMATION

A method for converting scanning values of an input scanning sequence to scanning values of an output scanning sequence is disclosed, for example, in European Patent No. 52,847. In accordance with the method in European Patent No. 52,847, scanning sequences are changed into scanning sequences with other scanning frequencies. The desired scanning values are determined by interpolating obtained scanning values. The interpolations are performed using interpolation filters.

However, the method of European Patent No. 52,847 has a number of disadvantages. For instance, the conversion method results in a converted signal that has an undesired noise signal of at least 3 db. The noise is attributed to the multiplication of the input scanning values with filter coefficients, and with a subsequent filter word length reduction. Furthermore, the quality of the output signal is reduced if the input scanning frequency and the output scanning frequency are not of an optimum quality. This may be caused, for example, by a poorly designed phase lock loop (PLL) circuit. In addition, the effort required for storing filter coefficients and the required logic for processing them can be considerable when certain input and output scanning frequencies exists.

SUMMARY OF THE INVENTION

Accordingly, it is an object of the present invention to reduce the above-discussed disadvantages by developing a method and apparatus for converting scanning values of an input scanning sequence which occur with an input scanning frequency into scanning values of an output scanning sequence which occur with an output scanning frequency.

The present invention achieves this objective by converting, in a first stage, scanning sequences with nominally the same (or approximately the same) scanning frequencies, wherein two scanning sequences are synchronized with each other. In a second stage, a fixed scanning frequency ratio converts one of the scanning sequences into a scanning sequence with a totally different scanning frequency.

The method of the present invention can be used where it is necessary to convert from one scanning frequency to another scanning frequency. In certain cases, i.e. with certain ratios of the input scanning frequency to the output scanning frequency, the present invention is particularly simple. The portion of the apparatus of the present invention that converts the scanning frequencies via a fixed ratio is very simple to design. In addition, the present invention does not require high quality clock signals in order to obtain a good conversion. Furthermore, the present invention performs the conversion with either little or no generation of an undesired noise signal.

An object of the present invention is to convert scanning values of an input scanning sequence which occur with an input scanning frequency, into scanning values of an output scanning sequence which occur with an output scanning frequency, comprising the steps of:

deriving a further scanning frequency from the input scanning frequency and the output scanning frequency;

converting the scanning values of the input scanning sequence by a first conversion into scanning values of a further scanning sequence with the further scanning frequency;

converting the scanning values of the further scanning sequence into scanning values of the output scanning sequence;

performing an adaptation on one of the two conversions of the scanning frequencies; and performing a scanning rate conversion with a predetermined ratio on the other of the two conversions.

An advantage of the present invention is that over an extended period of time, the input scanning frequency and the further scanning frequency differ from each other by only a small amount, whereas the phase relation of the input scanning frequency and the further scanning frequency greatly differ.

Another advantage of the present invention is that the output scanning frequency and the further scanning frequency can differ from each other by a small amount, while a phase relation of the two signals can be greatly different.

According to the present invention, the method can also include determining time differences from scanning times of the input scanning frequency and scanning times of the further scanning sequence, presetting a limit value for the time difference, in which the time difference is compared with the limit value, in that scanning values, which are assigned to a time difference which is greater than the limit value, are displaced in time with each other, so that the time difference is cancelled, and then converting scanning values assigned to a time difference that is less than the limit value by a change-over into scanning values of the further scanning sequence. The step of converting the scanning values can take place between scanning values of an input scanning sequence and scanning values of a further scanning sequence that are derived therefrom. In addition, the scanning values converting step delays the scanning values of the input scanning sequence by one scanning interval in order to obtain the scanning values of the further scanning sequence.

Another advantage of the present invention is that the scanning rate conversion is performed with a predetermined ratio and is chronologically and continuously recalculated.

According to another object of the present invention, an apparatus is disclosed for converting scanning values of an input scanning sequence which occur with an input scanning frequency, into scanning values of an output scanning sequence which occur with an output scanning frequency, comprising:

means for deriving a further scanning frequency from said input scanning frequency and said output scanning frequency;

first means for converting said scanning values of said input scanning sequence into scanning values of a further scanning sequence with said further scanning frequency;

second means for converting said scanning values of said further scanning sequence into scanning values of said output scanning sequence;

means for performing an adaptation on either said first converting means or said second converting means; and means for performing a scanning rate conversion with a predetermined ratio on either said first converting means or said second converting means that is not adapted by said adaptation means.

An advantage of the apparatus of the present invention is that the adaptation means comprises a synchronization circuit that adapts scanning values of a scanning sequence to given scanning times and a scanning rate converter that converts scanning values of a scanning sequence into scanning values of a scanning sequence having a different scanning frequency. According to the present invention, the synchronization circuit and the scanning rate converter are switched in series. Furthermore, the synchronization circuit comprises a memory, a computer, and a controller.

According to another object of the present invention, an apparatus is disclosed for converting scanning values of an input scanning sequence which occurs with an input scanning frequency, into scanning values of an output scanning sequence which occurs with an output scanning frequency, comprising:

a data source, such as a CD player, that produces the scanning values of an input scanning sequence which occurs with an input scanning frequency;

a converter, comprising:
  a synchronizer; and
  a scan rate converter, the synchronizer and scan rate converter converting the input scanning sequence which occurs with an input scanning frequency from the data source into the output scanning sequence which occurs with an output scanning frequency;

a first data bus that supplies scanning values from the data source to the converter;

a first transmitting line for transmitting the input scanning frequency from the data source to the converter;

a second data bus that supplies scanning values from the converter to a sink, such as a mixing console or digital operating studio; and a second transmitting line for transmitting the output scanning frequency from the converter to the sink.

The synchronizer of the present invention adapts scanning values of a scanning sequence to predetermined scanning times, while the scan rate converter converts scanning values of a scanning sequence into scanning values of a scanning sequence having a different scanning frequency.

BRIEF DESCRIPTION OF THE DRAWINGS

The foregoing and other objects, features, and advantages of the present invention will be apparent from the following more particular description of the preferred embodiment, as illustrated in the accompanying drawings in which reference characters refer to the same parts throughout the various view, and wherein:

FIG. 1 illustrates different chronological scanning sequences;

FIGS. 2 and 3 illustrate particular actions in the scanning sequences shown in FIG. 1;

FIGS. 4 and 5 illustrate schematic views of sections of certain scanning sequences;

FIG. 6 illustrates a schematic view of a processing unit for scanning sequences;

FIG. 7 illustrates a schematic view of an apparatus for executing the method according to the present invention; and FIG. 8 illustrates a portion of the apparatus in accordance with FIG. 7.

DESCRIPTION OF THE PREFERRED EMBODIMENTS

The drawings illustrate a two-stage method, in which a synchronization of scanning frequencies are performed in one stage, and subsequently, a conversion of the scanning frequencies is performed in a second stage. FIG. 1 discloses a time axis 1 upon which scanning times 2 of an output scanning frequency 3 and scanning times 4 of a further output scanning frequency 5 are recorded. Scanning values 6–13 of an input scanning sequence 14 are also discernable. For the present discussion, only the time at which the scanning values 6–13 are occurring is of interest. That is, the magnitude or value of the scanning values 6–13 are irrelevant.

The values of a corresponding, subsequent scanning sequence 25, which in this case has been synchronized, are designated as 6'–12'. Furthermore, the scanning values of an output scanning sequence 15, which occur at times 2 of the output scanning frequency 3, are designated in FIG. 1 by numerals 16–24. Time differences between the scanning values 6 and 6', 7 and 7', etc. of the input scanning sequence 14 and the further scanning sequence 25 are represented in FIG. 1 by arrows that are designated as 6''–12''. A distance 26 is set between the input scanning values 6 and 7, while a distance 27 is set between the further scanning values 6' and 7'.

A section of the illustration in accordance with FIG. 1 is shown in FIG. 2 for another time window. In FIG. 2, an input scanning value 28 coincides with a further scanning time 29. Since the input scanning frequency for this time window is just a little lower than the further scanning frequency, a previous input scanning value 30 is located just ahead of scanning time 31. Therefore, during synchronization of the input scanning sequence with the further scanning sequence, the input scanning value 30 is delayed until it coincides with the subsequent scanning time 31. Subsequent input scanning value 32, which actually should be associated with a scanning time 33, however, is already located on the other side of the scanning time 33. Thus, the subsequent input scanning value 32 is normally delayed until a scanning time 34. Therefore, a scanning value for the scanning time 33 is missing.

In FIG. 3, another time window, similar to the time window of FIG. 2, is shown. Input scanning value 35 actually coincides with a further scanning time 36. Since, for this time window, the input scanning frequency is just a little higher than the further scanning frequency, a previous input scanning value 37 is located just after a scanning time 38. During synchronization, the previous input scanning value 37 is delayed until it coincides with the further scanning time 36. In this way, the two input scanning values 35 and 37 fall into the further scanning time 36.

FIG. 4 schematically illustrates values for input and output scanning sequences during a predetermined time window. The time window contains pulses numbered from 1 to 16, and are recorded on line 40. Line 41 contains values $x_1$ to $x_{16}$ of a further scanning sequence. Line 42 shows corresponding values of a further scanning sequence delayed by a scanning interval. Line 43 contains values of an output scanning sequence that are generated using a method other than the method of the present invention, while line 44 contains values of an output scanning sequence that are generated in accordance with the method of the present invention.

FIG. 5 illustrates the same sequences of values as in FIG. 4. However, some sequences in FIG. 5 have different values. Lines 45-49 in FIG. 5 correspond with lines 40-44, respectively, of FIG. 4. The significance of the individual values will be discussed below.

FIG. 6 illustrates a schematic view of an annular memory 50 having memory locations 51, which, in the illustration, are partially occupied by scanning values $x_1$ to $x_8$. The representation of the memory 50 as being circularly shaped has nothing to do with its actual shape. Rather, the annular shape represents the operating principle of the memory 50 in order to convey a clearer explanation of the read/write operations of the memory 50.

A write-in pointer 52 is provided for writing information to the memory 50. Two read-out pointers 53 and 54 are provided for reading data from the memory 50. The read-out pointers 53 and 54 are disposed in such a way that they read out adjoining scanning values. In such an arrangement, which is advantageous for illustration purposes, all the pointers 52-54 are movable with respect to the memory 50. Alternatively, a pointer (or pair of pointers) can be fixed and the memory 50 can be considered to be rotatable. In actuality, a device for generating storage addresses corresponds to a pointer and nothing (but, electrical current) moves inside the memory. The two read-out pointers or outputs 53 and 54 are connected to corresponding multipliers 55, 56. Output 57 of multiplier 55 and output 58 of multiplier 58 are summed together by an adder 59 which, in turn, has an output 60.

FIG. 7 illustrates a block diagram of an apparatus, such as converter 83, for executing the method of the present invention. An input of the apparatus 83 is connected to a data source 61 via data bus 63. An output from the apparatus 83 is connected to a sink 62 via a data bus 64. The data source 61 comprises, for example, a CD player, in which case the scanning values of a scanning frequency are 44.1 kHz $\pm E$, where E represents a deviation from the ideal frequency. The sink 62 may comprises, for example, a digital operating studio or mixing console, which operates with a scanning frequency of exactly 48 kHz.

Converter 83 comprises a synchronization circuit 65 and a scanning rate converter 66. The synchronization circuit 65 and a scanning rate converter 66 are connected together via a data bus 67. Transmitting lines 68-70 are provided for transmitting the scanning frequencies. While FIG. 7 illustrates the scan rate converter 66 as being connected after the synchronization circuit 65, it should be obvious to one skilled in the art that the circuit arrangement can be reversed, so that the synchronization circuit 65 is connected to the output of the scanning rate converter 66.

FIG. 8 illustrates one example of the synchronization circuit 65. The synchronization circuit 65 comprises a memory 71 and a computer (also referred to as a filter) 72, which are connected together via a bus 73. An address generator 74 is connected to the memory 71 via an address bus 75. A coefficient generator 76 is connected to the computer 72 via a bus 77. An input bus 78 is connected to the memory 71, while an output of the computer 72 is connected to an output bus 79. Furthermore, a controller 80 is connected to the coefficient generator 76 and the address generator 74 via control line 81. Transmitting lines 68 and 70 are connected to the controller 80 and the address generator 74.

An input scanning sequence 14 having scanning values 6-13 (see FIG. 1) of a known input scanning frequency is available for executing the method of the present invention. A clock frequency, such as, for example, the desired output scanning frequency 3 for the output scanning sequence 15, which is emitted, for example, by the sink 62 shown in FIG. 7 is also available. The two scanning frequencies are continuously supplied to the synchronization circuit 65 via the transmitting lines 68-70 (FIGS. 7 and 8).

In the preferred embodiments, the controller 80 of the synchronization circuit 65 includes a computer portion 80a, as shown in FIG. 8, for calculating the further output scanning frequency 5. However, this is not absolutely necessary. The calculated information is continuously transmitted over control line 81 as a scanning frequency for the subsequent scanning sequence 25.

In order to calculate the further output scanning frequency, the computer portion 80a must recognize an input scanning frequency and a desired output scanning frequency. In this way, a scanning interval is set by the distance 26. The computer portion 80a calculates the further output scanning frequency from this, which must meet two conditions:

a) the ratio of the output scanning frequency or the input scanning frequency to the further scanning frequency should be as simple as possible, and should correspond as closely as possible to the ratio of the input scanning frequency to the output scanning frequency, or vice versa; and (b) the deviation between the input scanning frequency or the output scanning frequency and the further scanning frequency should be small, so that a scanning value is not missing (or becomes superfluous) more often than a predetermined period of time (for example, every second), as shown in FIGS. 2 and 3.

If, for example, the input scanning frequency is 44.1 kHz and the output scanning frequency is 48 Khz, it suffices, in accordance with the conditions cited above, to multiply the input scanning frequency by 160 and subsequently divide it by 147. While the further scanning frequency may deviate from the input scanning frequency or from the output scanning frequency, the deviation should be kept small so as to not adversely affect the conversion operation.

Once the further scanning frequency is known, two conversion procedures are available. In one procedure, the scanning values of the input scanning sequence are adapted by a first conversion to the further scanning frequency (for example, by synchronization) so that a further scanning sequence is created, and the latter is transferred by a second conversion to the output scanning sequence. The conversion takes place at differing, but fixed scanning rates. In the second procedure, the input scanning sequence is transferred by a first conversion into a further scanning sequence in accordance with a calculated scanning rate ratio, and is subsequently adapted to the output scanning frequency by a second conversion. The first procedure will be discussed in more detail, because the second procedure is easily derived from the first procedure.

Based on the known further scanning frequency, the synchronization circuit 65 can perform the processing of the input scanning sequence. Looking at it in connection with FIG. 1, this means that the input scanning values 6–12 are delayed in such a way that they become further scanning values 6'–12'. In this example, the delay times, represented by arrows 6"–12", become smaller over time (i.e., as one looks at FIG. 1 from left to right). However, they never fall below a limit 82, which is assigned to each scanning time 4.

In connection with an examination of FIG. 6, this means that the input scanning values are read into memory 50 (or 71 in FIG. 8) via the write-in pointer 52, and they are controlled by the further scanning frequency that is read out by the read-out pointer 54. They are then inputted into the computer 72 (FIG. 8), where they pass through the multiplier 56, which multiplies the value by one, and the adder 59, which adds zero to the value. It should be noted that this process continues, wherein arrows 11" and 12", as well as following arrows, not indicated, continue to be shortened, until the situation in accordance with FIG. 2 arises. In FIG. 2, one observes that the input scanning value 30 already lies on the other side of the limit 82. Before it can come to this, a further process is initiated which converts the input scanning value 30, chronologically considered, into a new input scanning value 30', but makes no changes in its value. This further process is referred to as a change-over. Two cases must be distinguished:

Case 1

The input scanning frequency must be smaller than the further scanning frequency; and

Case 2

The input scanning frequency must be greater than the further scanning frequency.

Case 1 is illustrated in FIG. 1. When the scanning values are read into memory 50, write-in pointer 52 must be continuously displaced in the direction of the read-out pointer 54 (if one assumes that the memory turns in a clockwise direction). When pointers 52, 54 are sufficiently close to each other, limit 82 has been reached and a change-over must begin. Coefficients are supplied to the multipliers 55 and 56 for the change-over. In the illustration in accordance with FIG. 8, the coefficients are inputted to the computer 72 from the coefficient generator 76 via the bus 77. This also means that the scanning values are read out from the memory 5 via the two read-out pointers 53 and 54. The operations performed with these scanning values are mathematically formulated, as follows:

$$y_i = (1-a_i)x_i + a_i \times x_{i-1}.$$

In this case, the scanning values designated by $x_{i-1}$ are supplied to the multiplier 55 and are multiplied by coefficients $a_i$, and the scanning values designated by $x_i$ are supplied to the multiplier 56 and are multiplied by coefficient $(1-a_i)$. If a change-over is performed and spread over eight scanning values, eight scanning values $c_1$ to $c_8$ are calculated as follows:

$$c_0 = 8/8x_5 + 0/8x_4 = x_4$$

$$c_1 = 7/8x_6 + 1/8x_5$$

$$c_2 = 6/8x_7 + 2/8x_6$$

$$c_3 = 5/8x_8 + 3/8x_7$$

$$c_4 = 4/8x_9 + 4/8x_8 = \tfrac{1}{2}(x_8 + x_9)$$

$$c_5 = 3/8x_{10} + 5/8x_9$$

$$c_6 = 2/8x_{12} + 6/8x_{10}$$

$$c_7 = 1/8x_{12} + 7/8x_{11}$$

$$c_8 = 0/8x_{13} + 8/8x_{12} = x_{12}$$

$$c_9 = 8/8x_{13} + 0/8x_{12} = x_{13}$$

It is noted that following the calculation of scanning value $c_8$, the coefficients are reversed, making it possible to calculate scanning value $c_9$ from the same scanning values in the same manner used to calculate scanning values $c_1$–$c_8$. To reuse the same scanning values, read-out pointers 53 and 54 are stopped and a new scanning value is read out over the eight new scanning values.

This process can be better understood by reference to the illustration in accordance with FIG. 4. An unbroken sequence of input scanning values $x_1$ to $x_{16}$ is shown on line 41, which is read out by means of the read-out pointer 54. A delayed sequence of the input scanning values $x_0$ to $x_{15}$ is shown on line 42. The delayed sequence results when the scanning values are simultaneously read out by the read-out pointer 53 and the read-out pointer 54. An examination of line 43 shows that the scanning value $x_8$ is read out twice if no change-over is performed. This would also be the case for the illustration in accordance with FIG. 2. Therefore, the scanning value 28 would be read out twice; once for scanning time 29 and once for scanning time 33. The individual scanning values of the new output scanning sequence are shown in line 44.

The change-over process is controlled by controller 80 (shown in FIG. 8). Time differences between the scanning times of the sequences are determined as they arrive via transmitting lines 68 and 70. The time differences are determined, for example, in accordance with the method and apparatus disclosed in European Patent No. 0084592. The time difference is compared with a predetermined time difference that corresponds to limit 82. In this way, it is determined when the change-over process is initiated. When the time comes, signals travel via control line 81 to the coefficient generator 76 and the address generator 74, so that the production of the coefficients is started and miscellaneous address jumps are triggered.

In Case 2, write-in pointer 52 moves counter-clockwise relative to the read-out pointer 54. As soon as the counterclockwise rotation is no longer possible, without a conflict between the write-in and read-out pointers being caused, a change-over is required. The change-over can be expressed in a mathematical form, as follows:

$$y_i = a_i x_i + (1-a_i)x_{i-1}.$$

In the second case, the scanning values designated by $x_{i-1}$ are supplied to the multiplier 55 and are multiplied by coefficients $1-a_i$, while the scanning values designated by $x_i$ are supplied to the multiplier 56 and are multiplied by coefficients $-a_i$. If a change-over is performed and spread over eight scanning values, the eight scanning values $c_1$ to $c_8$ are calculated as follows:

$$c_0 = 8/8x_5 + 0/8x_4 = x_5$$

$$c_1 = 7/8x_6 + 1/8x_5$$

$$c_2 = 6/8x_7 + 2/8x_6$$

$$c_3 = 5/8x_8 + 3/8x_7$$

$$c_4 = 4/8x_9 + 4/8x_8 = 1/2(x_8 + x_9)$$

$$c_5 = 3/8x_{10} + 5/8x_9$$

$$c_6 = 2/8x_{11} + 6/8x_{10}$$

$$c_7 = 1/8x_{12} + 7/8x_{11}$$

$$c_8 = 0/8x_{13} + 8/8x_{12} = x_{12}$$

$$c_9 = 8/8x_{14} + 0/8x_{15} = x_{13}$$

It is noted that following the calculation of the scanning value $c_8$, the coefficients are again reversed, so that the scanning value $c_9$ is calculated in the same way from the same scanning values, and the coefficients can be made available for the next change-over process. It is also noted that the scanning value $c_8$ is determined from the scanning values $x_{12}$ and $x_{13}$. However, in order to calculate the subsequent scanning value $c_9$ with reversed coefficients, the scanning values $x_{14}$ and $x_{15}$ must be used. Thus, rather than having the two read-out pointers 53 and 54 jump by one scanning value, the read-out pointers 53 and 54 must jump by two scanning values.

In Case 2, the process can be better understood by referring to FIG. 5. Lines 45-47 are the same as lines 40-42 in FIG. 4. It can be seen in line 48 that a scanning value is missing between the scanning values $x_7$ and $x_9$. This corresponds to the jump which the read-out pointers 53 and 5 make after the change-over.

In order to determine the size of the memory 50 (in FIG. 6; or memory 71 in FIG. 8) it can be assumed, for example, that periods without change-over would also lie between the individual change-over processes. The memory should be sufficiently large so that it can absorb momentary swings of the scanning frequencies. It should also be large enough so that change-overs are only occasionally triggered by nominally different scanning frequencies when the differences between the scanning intervals have been summed over a given time.

After the subsequent scanning sequence 25 has been generated from the input scanning sequence by the just described adaptation, conversion of the further scanning values into the output scanning sequence 15 takes place. For this purpose the scanning values are supplied to the scanning rate converter 66 via the bus 67 (in FIG. 7, or 79 in FIG. 8). The further scanning values are then converted into output scanning values in accordance with per se known principles, such as are described, for example, in *A Digital Signal Processing Approach to Interpolation*, by Schaefer and Rabiner, (Proc. IEEE 61-6, Jun., 1973). Since the present case is directed to converting synchronous sequences of scanning values, it is possible to use simple conversion principles, such as, for example, converting between fixed ratios of the scanning frequencies.

In the second embodiment, the conversion of the input scanning sequence with a given ratio of the scanning frequencies into the further scanning sequence takes place. Then, the further scanning sequence is converted into the output scanning sequence by synchronization, which has almost the same scanning frequency. This method can be understood by referring to the output scanning sequence 15 in FIG. 1 as the new input scanning sequence and the input scanning sequence 14 as the new output scanning sequence. All arrows, including the time axis 1, must then point in the other direction. That is, the arrows must be rotated to point 180 degrees in the opposite direction to that shown in FIG. 1 (i.e., towards the left). It is also noted that the given ratio of the scanning frequencies may also vary.

While the present invention has been particularly shown and described with reference to the preferred embodiments thereof, it is understood by those skilled in the art that various alterations in form and detail may be made without departing from the spirit and scope of the invention, as defined by the following claims.

What is claimed is:

1. A method for converting scanning values of an input scanning sequence which occurs with an input scanning frequency, into scanning values of an output scanning sequence which occurs with an output scanning frequency, comprising the steps of:
   deriving a further scanning frequency from the input scanning frequency and the output scanning frequency;
   converting the scanning values of the input scanning sequence by a first conversion into scanning values of a further scanning sequence with the further scanning frequency; and
   converting the scanning values of the further scanning sequence into scanning values of the output scanning sequence, one of said steps of converting the scanning values of the input scanning sequence or converting the scanning values of the further scanning sequence comprising the step of delaying one of the input scanning sequence or the further scanning sequence until the input scanning sequence and the further scanning sequence coincide with each other, the other step of converting the scanning values of the input scanning sequence or converting the scanning values of the further scanning sequence comprising the step of performing a scanning rate conversion with a predetermined ratio.

2. The method of claim 1, wherein the input scanning frequency and the further scanning frequency differ from each other by a small amount over a period of time, whereas a phase relation of the input scanning frequency and the further scanning frequency differ from each other by a large amount over the period of time.

3. The method of claim 1, wherein the output scanning frequency and the further scanning frequency differ from each other by a small amount, whereas a phase relation of the output scanning frequency and the further scanning frequency differ from each other by a large amount.

4. The method of claim 1, further comprising the steps of:
   determining a time difference between scanning times of the input scanning frequency and scanning times of the further scanning sequence at a predetermined period of time; and presetting a limit value for the time difference, and comparing the time difference with the limit value to determine when a change-over operation should be initiated.

5. The method of claim 4, wherein the scanning values converting step takes place between scanning values of an input scanning sequence and scanning values of a further scanning sequence that are derived therefrom.

6. The method of claim 5, wherein the scanning values converting step comprises delaying the scanning values of the input scanning sequence by one scanning interval in order to obtain the scanning values of the further scanning sequence.

7. The method of claim 1, wherein the step of performing a scanning rate conversion with a predetermined ratio comprises using a fixed ratio that is chronologically and continuously recalculated.

8. An apparatus for converting scanning values of an input scanning sequence which occurs with an input scanning frequency, into scanning values of an output scanning sequence which occurs with an output scanning frequency, comprising:
   means for deriving a further scanning frequency from said input scanning frequency and said output scanning frequency;
   first means for converting said scanning values of said input scanning sequence into scanning values of a further scanning sequence with said further scanning frequency; and
   second means for converting said scanning values of said further scanning sequence into scanning values of said output scanning sequence, one of said first and second converting means comprising means for delaying one of said input scanning sequence or said further scanning sequence until said input scanning sequence and said further scanning sequence coincide with each other, and the other of said first sand second converting means comprising means for performing a scanning rate conversion with a predetermined ratio.

9. The apparatus of claim 8, wherein said adaptation means comprises:
   a synchronization circuit that adapts scanning values of a scanning sequence to predetermined scanning times; and
   a scanning rate converter that converts scanning values of a scanning sequence into scanning values of a scanning sequence having a different scanning frequency.

10. The apparatus of claim 9, wherein said synchronization circuit and said scanning rate converter are connected in series.

11. The apparatus f claim 9, wherein said synchronization circuit comprises:
   a memory;
   a computer; and
   a controller.

12. The apparatus of claim 8, wherein said input scanning sequence which occurs with an input scanning frequency is produced by a data source.

13. The apparatus of claim 12, wherein said data source comprises a CD player.

14. The apparatus of claim 7, wherein said scanning values of an output scanning sequence which occurs with an output scanning frequency are inputted to a sink.

15. The apparatus of claim 14, wherein said sink comprises a mixing console.

16. An apparatus for converting scanning values of an input sequence which occurs with an input scanning frequency, into scanning values of an output scanning sequence which occurs with an output scanning frequency, comprising:
   a data source that produces said scanning values of an input scanning sequence which occurs with said input scanning frequency;
   a converter apparatus, comprising:
   a synchronizer; and
   a scan rate converter, said synchronizer and scan rate converter converting said input scanning sequence which occurs with an input scanning frequency from said data source into said output scanning sequence which occurs with an output scanning frequency;
   a first data bus that supplies scanning values from said data source to said converter apparatus;
   a first transmitting line for transmitting said input scanning frequency from said data source to said converter apparatus;
   a second data bus that supplies scanning values from said converter apparatus to a sink; and
   a second transmitting line for transmitting said output scanning frequency from said sink to said converter apparatus.

17. The apparatus of claim 16, wherein said synchronizer adapts scanning values of a scanning sequence to predetermined scanning times.

18. The apparatus of claim 16, wherein said scan rate converter converts scanning values of a scanning sequence into scanning values of a scanning sequence having a different scanning frequency.

19. The apparatus of claim 16, wherein said synchronizer comprises:
   a memory for storing scanning values;
   an address generator that selects addresses of said memory for inputting and outputting selected scanning values;
   a computer;
   a coefficient generator for supplying predetermined coefficients to said computer, said coefficients being applied to said scanning values outputted from said memory; and
   a controller that controls the operation of said synchronizer.

20. The apparatus of claim 19, wherein said controller is interfaced to said address generator and said coefficient generator.

21. The apparatus of claim 20, wherein said controller includes a computer portion for calculating a further output frequency.

22. The apparatus of claim 21, wherein said calculated further output frequency is transmitted to said coefficient generator for a subsequent scanning sequence.

23. An apparatus for converting scanning values of an input scanning sequence which occurs with an input scanning frequency, into scanning values of an output scanning sequence which occurs with an output scanning frequency, comprising:
   a synchronization circuit that converts said scanning values of said input scanning sequence into scanning values of a further scanning sequence with a further scanning frequency, said synchronization circuit having a controller that derives said further scanning frequency from said input scanning frequency and said output canning frequency; and a scanning rate converter that converts said scanning values of said further scanning sequence into scanning values of said output scanning sequence.

24. The apparatus of claim 23, wherein said synchronization circuit comprises a memory and a computer.

25. The apparatus of claim 23, wherein said input scanning sequence which occurs with an input scanning frequency is produced by a data source.

26. The apparatus of claim 25, wherein said data source comprises a CD player.

27. The apparatus of claim 23, wherein a sink emits said scanning values of an output scanning sequence which occurs with an output scanning frequency.

28. The apparatus of claim 27, wherein said sink comprises a mixing console.

* * * * *